United States Patent Office 3,764,485

Patented Oct. 9, 1973

3,764,485

METHOD OF MAKING AND USING ELECTROPLATING MATRIX

Dan Jacobus, New Brighton, Minn., assignor to Buckbee-Mears Company, St. Paul, Minn.

No Drawing. Filed Jan. 27, 1972, Ser. No. 221,388
Int. Cl. C23b 7/00
U.S. Cl. 204—11 5 Claims

ABSTRACT OF THE DISCLOSURE

An electroforming matrix is produced by first laying out on a base plate a pattern using a double layer of photoresist and then subjecting the plate with the photoresist to alternate cycles of heat treating and plating. A matrix processed in this fashion can be used over and over again many times to produce circuits and parts made by electroforming or electrodeposition.

BACKGROUND OF THE INVENTION

Field of the invention

This invention is intended for use in the production of miniature parts by a process which sometimes is interchangeably called electroplating, electroforming or electrodeposition. Briefly, this is usually done by placing a matrix in a suitable eletrolytic bath containing a suitable cathode or anode. The matrix comprises a metal base plate having a pattern of exposed areas defined by a covering layer of nonconductive material. A suitable material, usually metallic, is deposited on the exposed areas by electrolysis and afterwards the layer of deposited material is stripped off the matrix and the matrix is then reused to produce another piece. An important product produced in this fashion is very fine metallic mesh or screens ranging in the order of 500 lines per inch.

DESCRIPTION OF THE PRIOR ART

In general, the form of the article to be produced is defined on the matrix base plate by a layer of nonconductive material placed on a surface of the base plate in a pattern of exposed and protected areas on the base plate so that material will be electro-deposited only on the exposed areas. Although the pattern may be defined on the surface of the base plate in a number of ways, the most common is by using a light sensitive photoresist. In general, the matrix is prepared by initially coating a base metal sheet with a suitable photoresist and then exposing the photoresist to a suitable source of light through a suitable mask containing the desired pattern. In this fashion, the pattern is transferred to the photoresist layer in the form of crosslinked and uncrosslinked areas. A print of the pattern is then developed out by washing away with a suitable developer, either the crosslinked or the uncrosslinked portions of the resist. The areas that are developed out form the exposed portions of the base plate. Although matrices made in this manner have been successfully used for a number of years, they do have a number of deficiencies.

One difficulty has been the limited thickness of the parts which can be produced using matrices of this nature. This comes about because the thickness of the photoresist layer has to be limited in order to maintain the high degree of definition or line distinction so important in miniature precision parts which are made by electroplating. In addition, for certain parts such as fine line screens or mesh, light transmission through the mesh may be critical.

Another shortcoming of matrices heretofore has been the limited number of times that they can be reused before reprocessing. Each time a part is plated on the matrix, it is stripped or peeled off. Experience has shown that this can be done only a few times before the matrix sustains enough damage, usually to the photoresist layer, so that it no longer can be used and it must then be cleaned and reprocessed to produce a new matrix. This, of course, is both time consuming and costly.

Still another difficulty encountered with matrices heretofore, especially when trying to produce thin parts or pieces, has been the adhesion of the plated material to the base plate which makes it difficult to peel or strip the piece off the matrix without damaging either.

According to the teachings of this invention, the layer of photoresist can now be significantly thicker so that thicker pieces can be made without reducing the degree of definition that is required. Also, the photoresist has a significant increase in its strength of adherence to the base plate so that the matrix can be reused more often. Further, this is accomplished while still making it as easy, if not easier, to peel or strip the part off the matrix thereby not adding to production costs.

SUMMARY

A metal base plate is coated with a double layer of photoresist and a suitable pattern is printed on and developed out of the resist layer to produce a pattern array of exposed and protected areas on the base plate. The base plate, with the patterned photoresist, is then subjected to heat treatment. The base plate with the patterned photoresist is heat treated in an atmosphere which will produce an oxide coating on the base plate to enable the electroplated product to be easily stripped off the base plate. The matrix that is produced in this fashion then not only contains a thicker layer of photoresist than has been obtainable heretofore so that thicker electroplated or electrodeposited products can be produced, but it also can be reused a greater number of times than has been the case in the past yet produces parts having the same or even a better degree of precision than has been possible before.

DESCRIPTION OF THE PREFERRED EMBODIMENTS

The invention will be described as it would be used to produce a very fine nickel screen or mesh having, for example, in the order of 500 lines per inch, a thickness in the order of eight microns and outer dimensions in the order of eight by eight inches.

A base plate of nickel-coated copper, having suitable outer dimensions, is thoroughly cleaned and dried and then coated with two layers of photoresist material. Copper is popularly used because it is a good electrical conductor, is readily available, provides structural support and does not react adversely with nickel or the electroplating bath. Other materials can be used. In this example we are effectively plating the nickel product on a nickel layer. The manner of cleaning and preparing the base plate does not constitute a part of the invention. It can be done in a variety of manners and the procedures are well known to those of ordinary skill in the electroplating art. Similarly, the manner in which the two layers of photoresist are applied is a matter of choice. The type of photoresist material that is used may have a bearing on the manner in which it is applied to the base plate. Those of skill in the art are familiar with and are knowledgeable of the techniques used in applying the coatings to the base plate. In any event, the manufacturers of the photoresists ordinarily are available and are willing to describe and show the common and accepted manner of applying the coatings.

In the present example, the base plate is dipped vertically into a container of diluted Eastman Kodak KTFR photoresist (partially cyclized cis-polyisoprene based polymer) diluted with a suitable thinner and withdrawn at suitable rates to produce a coating of the desired thickness and then dried in an infrared oven at temperatures to drive off the residual solvent without causing cross-linking of the polymer. After cooling, the coated base plate is then dipped into and withdrawn from a container of Eastman Kodak's KPR photoresist (polyvinyl cinnamate based polymer) at suitable rates to produce a second coating of desired thickness and is then dried in an infrared oven at temperature and for a period of time to produce a dry second coating without crosslinking. The resulting thickness ratio of the KTFR coating to the KPR coating may be, in this example, in the order of three to one. After cooling, the coated base plate is then exposed to a suitable light source through a photographic mask containing the pattern of 500 lines per inch to print the pattern on the coating. The photoprinting step does not constitute a part of the invention and the photoprinting techniques are well known to those of skill in the art and the type of light used and the exposure times are readily selected by the artisans. In a similar manner, the developing of the printed pattern or image does not constitute a novel part of the instant invention and the developer fluid as well as the techniques involved are well known and available to those skilled in the art. In any event, the development step involves subjecting the printed base plate to a suitable developer fluid followed by a number of rinses to remove the resist from certain areas and thereby expose those areas of the base plate. Following this, the matrix is usually allowed to dry for a suitable period of time at room temperature. The result of the process to this point is a matrix consisting of a base plate covered with a patterned array of photoresist so that there are exposed and protected or covered areas of the base plate.

Next, the matrix is baked in order to drive off any residual solvents that had remained after developing and to further cure or harden the resist layer. In the present example, the matrix was baked for a suitable period of time in a dry atmosphere in a convection oven at a temperature in the range of about 80° C. to 120° C. After this first baking period, the matrix is cooled and then inserted in a suitable electrolytic bath containing a suitable anode and a thin layer of nickel is electrodeposited on the unprotected areas of the base plate. The constituency of the bath, the type of anode, the control of the electrodeposition process to insure uniform thickness, etc. are matters which are well within the skill of one familiar with the art of electroplating and are ordinarily selected in accordance with the type of materials involved and other factors. In the present example, the matrix was plated in a "Watts" nickel bath for a period of about 15 minutes at a rate of about two and one-half amperes. After removal from the bath, the matrix is rinsed and dried and then the layer of electroplated nickel is stripped off the matrix and ordinarily is discarded. This first intermediate plating step is to remove any scum or foreign matter or the like which might still have been present on the matrix up to this point.

After the first intermediate electroplated layer is stripped off, the matrix is baked again in a convection oven in a dry atmosphere at a temperature in the range of about 80° C. to 140° C. for at least 10 to 15 minutes. The main purposes here is to form an oxide coating on the exposed metal base to enhance the ease with which the finished product can be stripped off. It has been found that the higher temperatures are best for forming the oxide but at the same time they are likely to cause some distortion of the patterned resist. If the appearance of the finished product is critical, then the lower temperatures should be used but if the ease of release of the finished product is of primary importance then the higher temperatures can be used. The material of the plating surface may also bear on the selection of a suitable temperature within the stated range. Although temperatures as low as 80° C. can be used in this step, it has been found that the preferable lower temperature is in the order of about 100° C. As to the choice of baking time, it is generally related to the thickness and composition of the metal substrate or base.

The base should be uniformly heated so, in general, the thicker the base the longer the baking period. It is interesting to note that although the flow or melting temperature of the photoresist material used in this example is in the order of about 120° C. yet, by processing the matrix in the manner described to this point, it can be subjected to a baking temperature above the melting point and still remain intact.

After the matrix is cooled, it is now ready for production. The matrix is inserted in the electroplating bath under suitable controls and suitable electrical connections and a piece of mesh is electrodeposited. After each piece is made and stripped off, the matrix is baked at a temperature in the range of about 150° C. to 165° C. for about 10 to 15 minutes. The function here is to develop a more durable thin nickel oxide coating on the base plate which facilitates the release of the products from the matrix.

A matrix processed in this fashion was used to produce nickel screen or mesh containing 500 lines per inch and having a thickness in the order of eight microns. This was done by placing the matrix in a suitable bath and plating the nickel for about 8 minutes at the rate of about 2½ amps. After each piece was made and stripped off, the matrix was btked at about 160° C. for about 12 minutes. Over 50 pieces were made in this manner from one matrix before the photoresist deteriorated so that the matrix had to be discarded. Inspection of the mesh made from this matrix and a comparison to mesh having the same line density but made with an earlier type of matrix showed that the light transmission of the former was in the order of 65% as compared to that of the latter which was in the order of 60%. This indicates that if a screen or mesh was electroformed on a matrix made according to this invention to yield the same percentage of light transmission as in the past, the new mesh would be thicker and likely substantially more durable.

As an alternative method, it has been found that a saturated solution of potassium permanganate in water works as a descumming agent and does not adversely affect the resist on the matrix. This allows the resist to be subjected to the higher temperature level of around 140° C. without the intermediate baking and stripping steps. The matrix is subjected to the permanganate treatment after the developing step. When the image is completely dry, the matrix is dipped momentarily three times in the permanganate solution. The matrix is then thoroughly rinsed with deionized water and allowed to dry for about 15 minutes. After this the matrix is cured or baked at a temperature in the range of about 140° C. for about 15 minutes in a convection type oven. Again, the temperature range for this baking may be as low as 80° C. and the time may run from 10 to 15 minutes with the selection of the temperature and the time being based on the same criteria as explained previously. Again, after each piece is made and stripped off, the matrix is baked at a temperature in the range of about 150° C. to 165° C for about 10 to 15 minutes.

I claim:

1. A method of making an electroplating matrix, comprising the steps of:

(a) placing on a metallic base plate two layers of photoresist material, one layer comprising partially cyclized cis-polyisoprene based polymer and the other layer comprising polyvinyl cinnamate based polymer;

(b) photoprinting and developing out a pattern on both photoresist layers to produce a pattern of exposed and protected areas on said base plate;

(c) first baking the base plate with the patterned photoresist at a temperature in the range of about 80° C. to 120° C.;

(d) plating the baked base plate with a thin layer of metal after cooling;

(e) stripping off and discarding the thin plated layer;

(f) then again baking the base plate with patterned photoresist at a temperature in the range of about 80° C. to 140° C.

2. The method as set forth in claim 1 wherein the base plate with patterned photoresist is cleaned off with a saturated solution of potassium permanganate in water before the first baking.

3. A method of making an electroplating matrix, comprising the steps of:

(a) placing on a metallic base plate a layer of photoresist material comprising partially cyclized cis-polyisoprene based polymer;

(b) photoprinting and developing out a pattern on said photoresist layer to produce a pattern of exposed and protected areas on said base plate;

(c) first baking the base plate with the patterned photoresist at a temperature in the range of about 80° C. to 102° C.;

(d) plating the baked base plate with a thin layer of metal after cooling;

(e) stripping off and discarding the thin plated layer;

(f) then again baking the base plate with patterned photoresist at a temperature in the range of about 80° C. to 140° C.;

4. In the use of an electroplating matrix, the steps of:

(a) first making an electroplating matrix by (i) placing on a metallic base plate a layer of photoresist material comprising partially cyclized dis-polyisoprene based polymer, (ii) photoprinting and developong out a pattern on said photoresist layer to produce a pattern of exposed and protected areas on said base plate, (iii) first baking the base plate with the patterned photoresist at a temperature in the range of about 80° C. to 120° C., (iv) plating the baked base plate with a thin layer of metal after cooling, (v) stripping off and discarding the thin plated layer, (vi) then again baking the base plate with patterned photoresist at a temperature in the range of about 80° C. to 140° C.;

(b) then electroplating a layer of metal on the matrix after it has been cooled;

(c) then stripping off the electroformed layer of metal from the matrix;

(d) then baking the matrix at a temperature in the range of about 150° C. to about 165° C.; and (e) repeating step (d) after each piece is electroplated on and stripped off the matrix.

5. The invention as set forth in claim 4 further including the step of placing another layer of photoresist comprising polyvinyl cinnamate based polymer on the metallic base plate prior to photoprinting and developing out the pattern.

References Cited

UNITED STATES PATENTS

| | | | |
|---|---|---|---|
| 454,381 | 6/1891 | Reinfeld | 204—281 |
| 879,859 | 2/1908 | Edison | 204—281 |
| 1,388,754 | 8/1921 | Pechkranz | 204—11 |
| 2,765,230 | 10/1956 | Tinklenberg | 204—11 |

OTHER REFERENCES

Kodak Photosensitive Resists for Industry, Kodak Industrial Data Book P–7, 1st ed, 2nd ptg., 1964, Eastman Kodak Co. Rochester, N. Y., pp. 11, 19–22, 32 and S4.

DAVID KLEIN, Primary Examiner

U.S. Cl. X.R.

96—35.1, 36, 38.2

UNITED STATES PATENT OFFICE
CERTIFICATE OF CORRECTION

Patent No. 3,764,485 Dated October 9, 1973

Inventor(s) Dan Jacobus

It is certified that error appears in the above-identified patent and that said Letters Patent are hereby corrected as shown below:

Column 5, line 17, change "102$^{o}$" to -- 120$^{o}$ --.

line 23, change semicolon (;) to period (.).

line 28, change "dis" to -- cis --.

line 29, change "developong" to -- developing --.

Signed and sealed this 1st day of April 1975.

(SEAL)
Attest:

RUTH C. MASON
Attesting Officer

C. MARSHALL DANN
Commissioner of Patents
and Trademarks

FORM PO-1050 (10-69)
USCOMM-DC 60376-P69
☆ U.S. GOVERNMENT PRINTING OFFICE : 1969 O—366-334.